(12) United States Patent
Hayakawa et al.

(10) Patent No.: US 8,932,686 B2
(45) Date of Patent: *Jan. 13, 2015

(54) METHOD FOR PRODUCING PIEZOELECTRIC COMPOSITE SUBSTRATE

(75) Inventors: Norihiro Hayakawa, Yasu (JP); Takashi Iwamoto, Kusatsu (JP); Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 607 days.

This patent is subject to a terminal disclaimer.

(21) Appl. No.: 12/608,120

(22) Filed: Oct. 29, 2009

(65) Prior Publication Data

US 2010/0108248 A1    May 6, 2010

(30) Foreign Application Priority Data

Oct. 31, 2008   (JP) ................................. 2008-282212

(51) Int. Cl.
| | |
|---|---|
| C23C 14/00 | (2006.01) |
| H01L 41/312 | (2013.01) |
| H03H 3/02 | (2006.01) |
| H01L 41/257 | (2013.01) |

(52) U.S. Cl.
CPC .............. *H01L 41/312* (2013.01); *H03H 3/02* (2013.01); *H01L 41/257* (2013.01)
USPC ......................................... 427/523; 427/529

(58) Field of Classification Search
CPC .......... C23C 14/00; C23C 14/08; C23C 14/48
USPC .......................................... 427/523, 527, 529
See application file for complete search history.

(56) References Cited

U.S. PATENT DOCUMENTS

| | | | |
|---|---|---|---|
| 5,966,620 A | 10/1999 | Sakaguchi et al. | |
| 5,998,907 A | 12/1999 | Taguchi et al. | |
| 6,445,265 B1 | 9/2002 | Wright | |
| 2003/0010275 A1 | 1/2003 | Radojevic et al. | |
| 2003/0056718 A1 | 3/2003 | Kawahara et al. | |
| 2004/0101990 A1* | 5/2004 | Dunn et al. ..................... | 438/48 |

FOREIGN PATENT DOCUMENTS

| | | |
|---|---|---|
| FR | 2 914 492 A1 | 10/2008 |
| JP | 10-200080 A | 7/1998 |
| JP | 11-55070 A | 2/1999 |

(Continued)

OTHER PUBLICATIONS

Iwamoto et al., "Method for Manufacturing Piezoelectric Device,"; U.S. Appl. No. 12/608,113, filed Oct. 29, 2009.

(Continued)

*Primary Examiner* — Dah-Wei D Yuan
*Assistant Examiner* — Nga Leung V Law
(74) *Attorney, Agent, or Firm* — Keating & Bennett, LLP

(57) ABSTRACT

A method for producing a piezoelectric composite substrate having a single-crystal thin film of a piezoelectric material includes an ion-implantation step and a separation step. In the ion-implantation step, $He^+$ ions are implanted into the single-crystal base made of the piezoelectric material to form localized microcavities in a separation layer located inside the single-crystal base and apart from a surface of the single-crystal base. In the separation step, the microcavities formed in the ion-implantation step are subjected to thermal stress to divide the separation layer of the piezoelectric single-crystal base, thereby detaching the single-crystal thin film.

7 Claims, 3 Drawing Sheets

(56) References Cited

FOREIGN PATENT DOCUMENTS

| | | |
|---|---|---|
| JP | 2002-503885 A | 2/2002 |
| JP | 2002-534886 A | 10/2002 |
| JP | 2003-017967 A | 1/2003 |
| JP | 2003-32409 A | 1/2003 |
| JP | 2003-095798 A | 4/2003 |
| JP | 2005-093898 A | 4/2005 |

OTHER PUBLICATIONS

Iwamoto, "Method for Manufacturing Electronic Device and Method for Manufacturing Piezoelectric Device,"; U.S. Appl. No. 12/608,115, filed Oct. 29, 2009.

Osugi et al., "Single Crystal FBAR With LiNbO3 and LiTaO3 Piezoelectric Substance Layers", IEEE MTT-S International Microwave Symposium, 2007, pp. 873-876.

Bruel, "Silicon on Insulator Material Technology", Electronic Letters, Jul. 6, 1995, pp. 1201 & 1202, vol. 31, Issue 14.

Levy et al., "Fabrication of Single-Crystal Lithium Niobate Films by Crystal Ion Slicing", Applied Physics Letters, Oct. 19, 1998, pp. 2293-2295, vol. 73, No. 16.

Official Communication issued in corresponding Japanese Patent Application No. 2008-282212, mailed on Jan. 18, 2011.

Official Communication issued in corresponding Japanese Patent Application No. 2008-282212, mailed on Aug. 24, 2010.

Official Communication issued in corresponding European Patent Application No. 09173492.1, mailed on Aug. 3, 2011.

\* cited by examiner

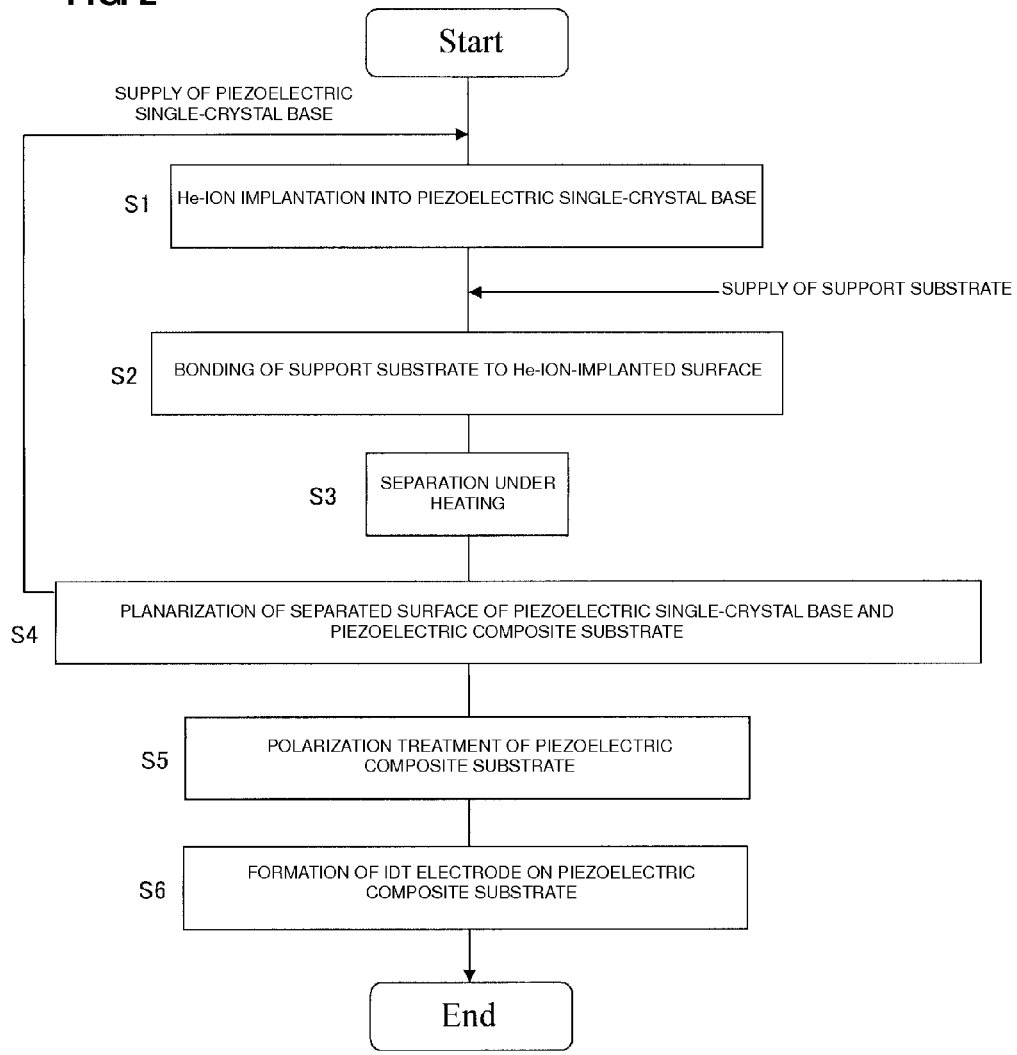

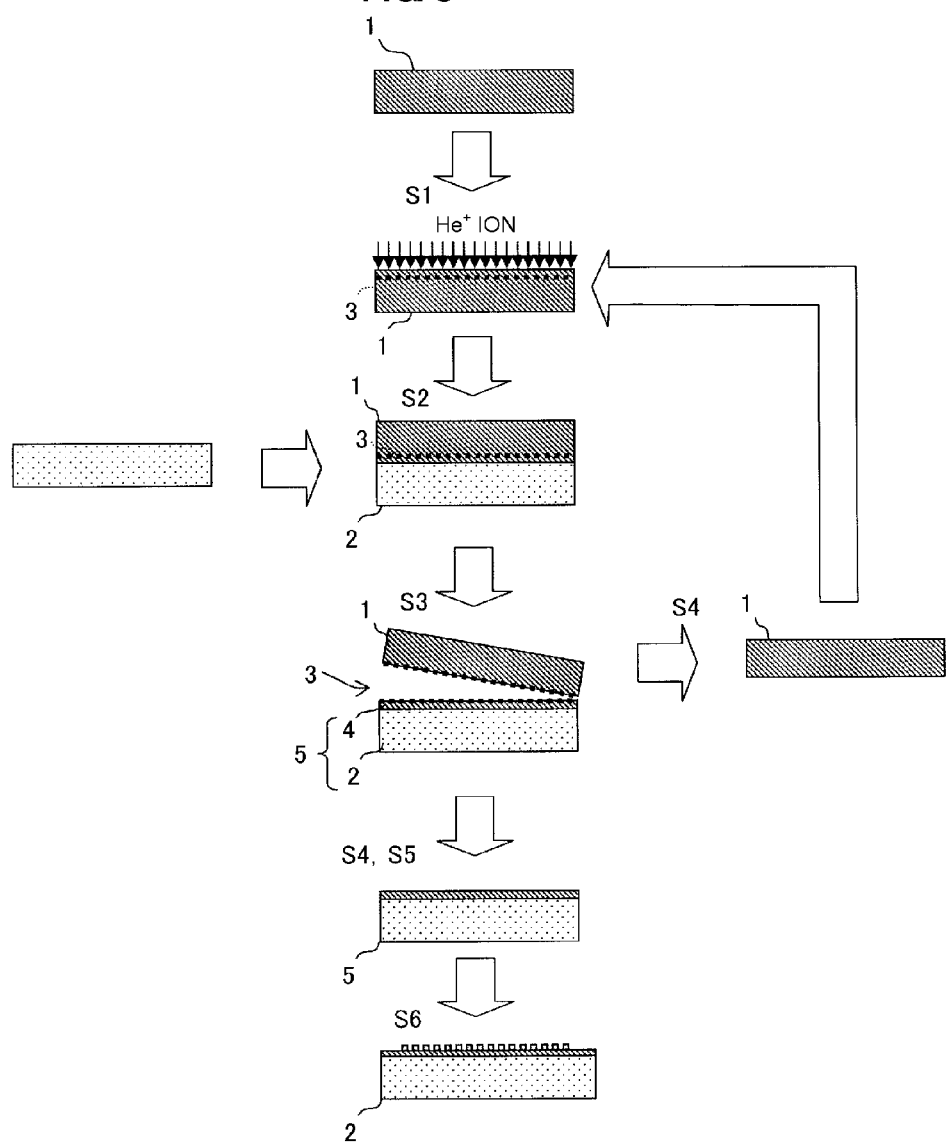

US 8,932,686 B2

METHOD FOR PRODUCING PIEZOELECTRIC COMPOSITE SUBSTRATE

BACKGROUND OF THE INVENTION

1. Field of the Invention

The present invention relates to a method for producing a piezoelectric composite substrate having a single-crystal thin film made of a piezoelectric material.

2. Description of the Related Art

In recent years, piezoelectric elements including a piezoelectric composite substrate with a single-crystal thin film made of a piezoelectric material have been developed. The single-crystal thin film made of a piezoelectric material has been produced by a first production process including depositing a piezoelectric material, such as AlN or ZnO, using sputtering or CVD (for example, see Y. Osugi et al.; "Single Crystal FBAR With LiNbO$_3$ and LiTaO$_3$", 2007IEEE MTT-S International Microwave Symposium, pp. 873-876) or a second production process including polishing a single-crystal base made of a piezoelectric material (for example, see M. Bruel; "Silicon On Insulator Material Technology", Electronics Letters, vol. 31, Issue 14, Jul. 6th, 1995, p. 1201).

Alternatively, a third production process has been used. The third production process includes implanting helium ions into a Z-cut LiNbO$_3$ substrate to form a damaged crystalline layer and removing the damaged crystalline layer by wet etching to produce a piezoelectric single-crystal thin film (see "Fabrication Of Single-Crystal Lithium Niobate Films By Crystal Ion Slicing", Applied Physics Letters Volume 73, Number 16).

In the first production process, a deposition temperature and deposition conditions for aligning the orientation direction of the crystal axis of a piezoelectric material severely limit the materials which can be used. Even when an alignment film is provided, the film has a c-axis orientation in which the orientation direction of the crystal axis is aligned vertically with respect to a substrate on which piezoelectric film is disposed. In this case, the orientation direction of the crystal axis cannot be controlled. Thus, the mode of vibration cannot be controlled by slanting the orientation direction of the crystal axis.

In the second production process, since the single-crystal base made of the piezoelectric material is polished, most of the piezoelectric material is discarded as shavings, which results in poor efficiency of utilization of the piezoelectric material. Furthermore, the thickness of the resulting thin film varies due to the unevenness in polishing speed and the degree of undulation of the base. Thus, it is difficult to control the polishing so as to provide a uniform thickness, which causes poor productivity.

In the third production process, the use of wet etching increases the production cost. Furthermore, an electrode cannot be provided at a location that is to be wet etched. Thus, when the electrode is arranged on a laminating surface between the piezoelectric single-crystal thin film and a support substrate, the electrode is formed after wet etching. In this case, the thin film has a low stiffness and thus is difficult to handle. Therefore, the thin film is likely to be broken.

SUMMARY OF THE INVENTION

To overcome the problems described above, preferred embodiments of the present invention provide a method for producing a piezoelectric composite substrate having a single-crystal thin film made of a piezoelectric material.

According to a preferred embodiment of the present invention, a method for producing a piezoelectric composite substrate having a single-crystal thin film made of a piezoelectric material includes an ion-implantation step and a separation step. In the ion-implantation step, rare-gas ions are implanted into the single-crystal base made of the piezoelectric material to form localized microcavities in a separation layer located inside the single-crystal base and spaced apart from a surface of the single-crystal base. In the separation step, the microcavities formed in the ion-implantation step are subjected to thermal stress to divide the separation layer of the piezoelectric single-crystal base, thereby detaching the single-crystal thin film.

In this production method, in the ion-implantation step, the localized microcavities are formed in the separation layer located inside the single-crystal base and spaced apart from the surface of the single-crystal base. In the separation step, the separation layer of the single-crystal base is divided to detach the single-crystal thin film. Thus, the single-crystal base of the piezoelectric material can be reused, thereby increasing efficiency of utilization of the piezoelectric material. Furthermore, the thickness of the thin film is determined by the energy of implantation in the ion-implantation step, which enables the thin film to have a uniform thickness. In addition, the mode of vibration can be controlled by regulating the direction of arrangement of the single-crystal base made of the piezoelectric material to slant the orientation direction of the crystal axis. Moreover, ion implantation affects only the separation layer and thus does not significantly affect the other portion of the piezoelectric composite substrate.

In the ion-implantation step, rare-gas ions are preferably used. The reason for this is that a rare-gas element has a less reactivity with elements defining the piezoelectric material as compared to other element because the outermost electron orbit of the rare-gas element is filled with electrons. Similar to a hydrogen-ion implantation used to form a semiconductor thin film or other suitable thin film, if ions of an element, including hydrogen, in which the outermost electron orbit is not filled with electrons are used for the production of a thin film of a piezoelectric material, the ions react with elements defining the piezoelectric material to form stronger bonds. With hydrogen ions, the bonds are difficult to cut because hydrogen has a low mass, which results in low efficiency of the formation of microcavities. In contrast, by using the rare-gas ions according to preferred embodiments of the present invention, the reactivity of the rare-gas ions with the elements defining the piezoelectric material is less than that of the above-described ions. Furthermore, the rare-gas ion has a higher mass than that of the hydrogen ion, such that microcavities can be efficiently formed.

In the ion-implantation step, ions of a rare-gas element having a higher ionization energy than that of hydrogen are preferably used as the rare-gas ions. More preferably, helium ions, for example, are used.

FIG. 1 is a graph showing the relationship between the atomic number and the ionization energy of elements.

As shown in this graph, each of helium, neon, argon, and krypton has a higher ionization energy than that of hydrogen. Among these, helium has the largest ionization energy. When a piezoelectric single-crystal thin film is formed using ions having a large ionization energy, bonds can be efficiently produced due to the release of energy during deionization, thereby efficiently forming the microcavities.

In the ion-implantation step, the density of the implanted rare-gas ions is preferably set from about $2 \times 10^{16}$ atom/cm$^2$ to about $5 \times 10^{16}$ atom/cm$^2$, for example. A density of the implanted rare-gas ions of about $2\times10^{16}$ atom/cm² results in the generation of microcavities in the separation step to the extent that the single-crystal base made of the piezoelectric material can be divided at a defective layer in the separation step, which results in the formation of the single-crystal thin film of the piezoelectric material. When a density of the implanted rare-gas ions is set to about $8\times10^{16}$ atom/cm² which exceeds about $5\times10^{16}$ atom/cm², an excessive amount of microcavities is generated in the defective layer, and the single-crystal base of the piezoelectric material is disadvantageously divided at the defective layer by heat generated in the ion-implantation step. In this case, production quality cannot be ensured. Thus, the density of the implanted rare-gas ions is preferably set to range from about $2\times10^{16}$ atom/cm² to about $5\times10^{16}$ atom/cm², for example, to ensure the production quality.

Preferably, the method for producing a piezoelectric composite substrate further includes a bonding step of bonding a support substrate to be formed into the piezoelectric composite substrate to a surface of the single-crystal base from which the single-crystal thin film is detached, in which the bonding step is performed between the ion-implantation step and the separation step. Preferably, the method for producing a piezoelectric composite substrate further includes a planarization step of planarizing a surface of the single-crystal base and a surface of the single-crystal thin film, the surface of the single-crystal base being formed by detaching the single-crystal thin film.

Other features, elements, characteristics and advantages of the present invention will become more apparent from the following detailed description of preferred embodiments of the present invention with reference to the attached drawings.

BRIEF DESCRIPTION OF THE DRAWINGS

FIG. 2 shows a flow chart of a method for producing a surface acoustic wave resonator according to a first preferred embodiment of the present invention.

FIG. 3 is a schematic view showing a piezoelectric composite substrate, a piezoelectric single-crystal base, and a support substrate in steps in the flow chart according to the first preferred embodiment of the present invention.

DETAILED DESCRIPTION OF PREFERRED EMBODIMENTS

Figure 1:
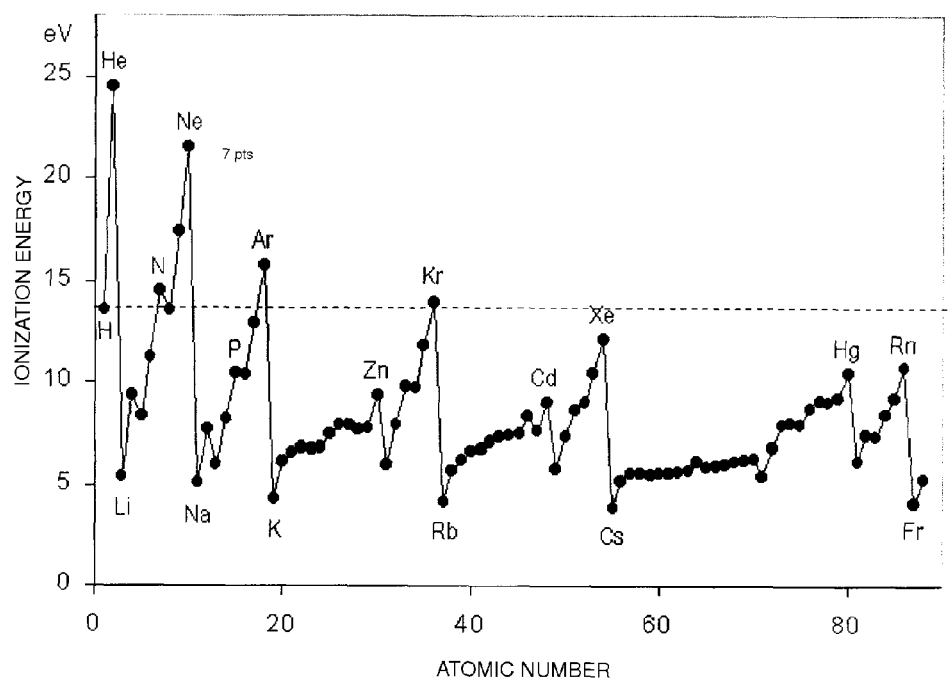
FIG. 1 is a graph showing the relationship between the atomic number and the ionization energy of elements.

A method for producing a piezoelectric composite substrate according to a preferred embodiment of the present invention will be described below with reference to a method for producing a surface acoustic wave resonator as an example. In this preferred embodiment, $LiNbO_3$ is preferably used as a piezoelectric material. A Si substrate is preferably used as a support substrate.

FIG. 2 shows a flow chart of the method for producing a surface acoustic wave resonator according to this preferred embodiment. FIG. 3 is a schematic view showing a piezoelectric composite substrate, a piezoelectric single-crystal base, and a support substrate in steps in the flow chart.

In this production process, an ion-implantation step (S1) of implanting $He^+$ ions into a mirror-polished main surface of a piezoelectric single-crystal base 1 is performed. Here, the implantation energy of $He^+$ ions is preferably set to about 150 KeV, for example. The dose level (density of implanted ions) is preferably set to about $2\times10^{16}$ atom/cm², for example. In this case, $He^+$ ions are preferably accumulated at a depth of about 0.5 μm, for example, below the main surface of the piezoelectric single-crystal base 1 to form microcavities. This plane located at a depth of about 0.5 μm below the main surface of the piezoelectric single-crystal base 1 is defined as a separation layer 3.

In the case of producing a surface acoustic wave resonator, the crystal orientation of the piezoelectric material affects its electromechanical coefficient, frequency-temperature characteristics, and sound velocity, and thus, has an important effect on, for example, the frequency, bandwidth, and insertion loss of the surface acoustic wave resonator. Appropriate control of the crystal orientation in the vicinity of the main surface of the piezoelectric single-crystal base 1 in this step results in a surface acoustic wave resonator having excellent characteristics and properties. In this preferred embodiment, the crystal orientation in the vicinity of the main surface of the piezoelectric single-crystal base 1 can be controlled, which results in a high degree of design flexibility, e.g., the frequency, bandwidth, insertion loss, electromechanical coefficient, frequency-temperature characteristics, and sound velocity of a surface acoustic wave resonator to be produced.

A bonding step (S2) of bonding the main surface of the piezoelectric single-crystal base 1 to a main surface of a support substrate 2 is performed. Here, there is a difference in the coefficient of linear expansion between the piezoelectric single-crystal base 1 made of $LiNbO_3$ and the support substrate 2 made of Si. Thus, the main surface of the piezoelectric single-crystal base 1 and the main surface of the support substrate 2 are activated with plasma and bonded in vacuo by direct bonding at room temperature.

A separation step (S3) is performed, the separation step including disposing the piezoelectric single-crystal base 1 and the support substrate 2, which have been bonded to each other, in a heated environment preferably with a temperature of about 500° C., for example, to divide the separation layer 3. In this case, the microcavities in the separation layer 3 are grown by thermal stress. A portion located from the main surface of the piezoelectric single-crystal base 1 to the separation layer 3, the portion preferably having a thickness of about 0.5 μm, for example, is detached as a piezoelectric single-crystal thin film 4. The piezoelectric single-crystal thin film 4 defines a piezoelectric composite substrate 5 together with the support substrate 2.

The thickness of the piezoelectric single-crystal thin film 4 is determined by the energy of ion implantation. Unlike polishing, the thickness is independent of the undulation of the substrate and thus is stable. The sound velocity of a surface acoustic wave is determined by the thickness. The production method according to this preferred embodiment, therefore, provides a surface acoustic wave resonator having stable performance.

As step (S4) of polishing the separated surface of the remaining piezoelectric single-crystal base 1 and the separated surface of the piezoelectric composite substrate 5, chemical-mechanical polishing (CMP), for example, is preferably performed. Here, each of the separated surface of the piezoelectric single-crystal base 1 and the separated surface of the piezoelectric composite substrate 5 has roughness about 1 nm, for example, as a root-mean-square value (RMS). Thus, mirror polishing is performed by CMP such that the roughness is less than about 1 nm, for example. In CMP, a portion located within about 100 nm from each of the main surfaces in the depth direction is removed. The mirror-polished piezoelectric single-crystal base 1 is used again in the ion-implantation step.

The piezoelectric single-crystal base 1 after mirror polishing is reused. Thus, several tens to several hundreds of piezoelectric single-crystal thin films 4 can be provided from the expensive piezoelectric single-crystal base 1, thereby reducing the amounts of Li and Ta, for example, that is used per piezoelectric single-crystal thin film 4, and thus, reducing the environmental impact. Furthermore, the use of the inexpensive support substrate 2 made of Si, for example, provides the piezoelectric composite substrate 5 at low cost. The reasons the piezoelectric single-crystal base 1 is expensive are that the growing speed of the single crystal is slow, it is difficult to slice the piezoelectric single-crystal base 1 because it easily breaks, and the materials, such as Li and Ta, for example, are rare materials.

A polarization step (S5) of polarizing the mirror-polished piezoelectric composite substrate 5 is performed. Here, the piezoelectric single-crystal thin film 4 of the piezoelectric composite substrate 5 is preferably subjected to polarization treatment by applying a pulse voltage of about 22 kV, for example, and a pulse width of about 5 ms, for example, in an environment with a temperature of about 400° C., for example. The polarization treatment is performed to repair partial polarization reversal due to the change in electric dipole states in the piezoelectric single crystal by ion implantation and heat treatment. The partial polarization reversal is not preferable because it causes deterioration in piezoelectricity. The implementation of this step can preserve piezoelectricity. The electric dipoles, which can be subjected to polarization reversal, in the piezoelectric single crystal are generated by the phenomenon of spontaneous polarization in which electric dipoles generated by allowing positively charged atoms to shift to a negative electrode side and allowing negatively charged atoms to shift to a positive electrode side in an electric field in the crystal remain polarized even when the application of the electric field is stopped.

The polarization step is preferably performed after the separation step. The polarization step is preferably performed at about 200° C. to about 1,200° C., for example, in view of the melting points of the support substrate and electrodes and the difference in thermal coefficient of expansion. A higher temperature results in a reduced coercive electric field, thereby reducing the applied electric field. When the electric field is intermittently applied for a duration of about 1 μs to about 1 minute, damage to the crystal due to a direct electric field can be prevented, which is preferable. Furthermore, heating at about 200° C. or greater, for example, is preferable because the strain in the crystal due to ion implantation is relaxed. A heating temperature for reducing the strain in the crystal may preferably be set to at least about 100° C. lower than the Curie temperature, for example, in order to avoid the disappearance of polarization.

As a next step (S6), IDT electrodes preferably made of Al, for example, are formed on the piezoelectric single-crystal thin film 4 of the piezoelectric composite substrate 5 preferably by photolithography, for example, to define a surface acoustic wave resonator filter.

When a surface acoustic wave resonator filter is used as an RF filter for use in mobile phones, a high power of about 1 W to about 2 W, for example, is applied. Power handling capability of the surface acoustic wave resonator filter is significantly affected by the temperature of an IDT region when an electric signal is applied. When the IDT region has a high temperature of, for example, about 250° C. by applying power, a time until a surface acoustic wave resonator is broken is significantly reduced. The increase in the temperature of the IDT region is attributed to the fact that Joule heat caused by electrical ohmic loss and heat generation caused by elastic sound absorption are not sufficiently dissipated because the piezoelectric substrate has low thermal conductivity. A surface acoustic wave resonator filter according to a preferred embodiment of the present invention includes a thin film preferably made of $LiTaO_3$ or $LiNbO_3$, for example, having a lower thermal conductivity than that of Si and a support substrate preferably made of Si, for example, having a high thermal conductivity. Thus, the surface acoustic wave resonator filter has improved heat dissipation properties and thus can withstand high power application.

According to a preferred embodiment of the present invention, the method for producing a surface acoustic wave resonator has been described above. Furthermore, according to various preferred embodiments of the present invention, methods for producing a bulk acoustic wave resonator and a boundary acoustic wave resonator can also be provided. The bulk acoustic wave resonator and the surface acoustic wave resonator may preferably have typical structures. The boundary acoustic wave resonator may have a structure disclosed in, for example, Japanese Patent Application No. 2003-32409.

In this preferred embodiment, $He^+$ ions, for example, are preferably used as rare-gas ions. According to preferred embodiments of the present invention, other rare gas ions may preferably be used. Preferred non-limiting examples thereof include ions of neon, argon, and krypton, which have a higher ionized energy than that of hydrogen.

While preferred embodiments of the invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing a piezoelectric composite substrate including a single-crystal thin film made of a piezoelectric material, the method comprising:
    an ion-implantation step of implanting rare-gas ions into a single-crystal base made of the piezoelectric material to form localized microcavities in a separation layer located inside the single-crystal base and spaced apart from a surface of the single-crystal base;
    a separation step of subjecting the microcavities formed in the ion-implantation step due to thermal stress and dividing the separation layer of the single-crystal base to detach the single-crystal thin film;
    a polishing step of polishing a surface of the single-crystal thin film at which the single-crystal thin film is divided from the single-crystal base so as to have a roughness of less than about 1 nm; and
    a polarization step of polarizing the piezoelectric composite substrate by intermittently applying a pulse voltage to the single-crystal thin film at a temperature of above 200° C. to about 1200° C. and at a temperature that is at least about 100° C. lower than the Curie temperature of the piezoelectric material; wherein
    the polarization step is performed after the separation step.

2. The method according to claim 1, wherein in the ion-implantation step, ions of a rare-gas element having a higher ionization energy than that of hydrogen are used as the rare-gas ions.

3. The method according to claim 2, wherein in the ion-implantation step, helium ions are used as the rare-gas ions.

4. The method according to claim 1, wherein in the ion-implantation step, a density of the implanted rare-gas ions is about $2\times10^{16}$ atom/$cm^2$ to about $5\times10^{16}$ atom/$cm^2$.

5. The method according to claim 1, wherein
    the polishing step includes polishing a surface of the single-crystal base from which the single-crystal thin film is detached.

6. The method according to claim 1, further comprising:
a bonding step of bonding a support substrate to a surface of the single-crystal base from which the single-crystal thin film is detached.

7. The method according to claim 6, wherein the bonding step is performed between the ion-implantation step and the separation step.

* * * * *